(12) United States Patent
Lin

(10) Patent No.: US 8,854,147 B2
(45) Date of Patent: Oct. 7, 2014

(54) CRYSTAL OSCILLATOR WITH ELECTROSTATIC DISCHARGE (ESD) COMPLIANT DRIVE LEVEL LIMITER

(71) Applicant: Google Inc., Mountain View, CA (US)

(72) Inventor: Cheng-Yi Andrew Lin, Mountain View, CA (US)

(73) Assignee: Google Inc., Mountain View, CA (US)

( * ) Notice: Subject to any disclaimer, the term of this patent is extended or adjusted under 35 U.S.C. 154(b) by 134 days.

(21) Appl. No.: 13/650,956

(22) Filed: Oct. 12, 2012

(65) Prior Publication Data

US 2014/0104009 A1  Apr. 17, 2014

(51) Int. Cl.
  *H03B 5/36*  (2006.01)
(52) U.S. Cl.
  CPC ............... *H03B 5/362* (2013.01); *H03B 5/364* (2013.01)
  USPC ...................... 331/116 FE; 331/158; 331/160
(58) Field of Classification Search
  CPC .......... H03B 5/32; H03B 5/362; H03B 5/364; H03B 2200/0012
  USPC ......... 331/116 R, 116 FE, 158, 160, 182, 183
  See application file for complete search history.

(56) References Cited

U.S. PATENT DOCUMENTS

| | | | |
|---|---|---|---|
| 3,555,374 A | 1/1971 | Usuda | |
| 4,060,772 A | 11/1977 | Yamada et al. | |
| 4,189,739 A | 2/1980 | Copeland | |
| 5,691,557 A | 11/1997 | Watanabe | |
| 6,320,473 B1 * | 11/2001 | Leuschner | 331/116 FE |
| 6,593,823 B2 * | 7/2003 | Nakamiya et al. | 331/74 |
| 6,788,158 B2 | 9/2004 | Kato et al. | |
| 7,193,483 B2 * | 3/2007 | Sheng | 331/108 C |
| 7,683,728 B2 * | 3/2010 | Maede | 331/116 FE |
| 8,653,900 B2 * | 2/2014 | Sato et al. | 331/158 |
| 2006/0214790 A1 | 9/2006 | Masciantonio | |
| 2008/0116984 A1 | 5/2008 | Maede | |

FOREIGN PATENT DOCUMENTS

| | | |
|---|---|---|
| JP | 60034051 | 2/1985 |
| JP | 8-46427 A | 2/1996 |
| JP | 2011-199334 A | 10/2011 |

OTHER PUBLICATIONS

ISR for PCT/US2013/063478 mailed Jan. 29, 2014.

* cited by examiner

*Primary Examiner* — Ryan Johnson
(74) *Attorney, Agent, or Firm* — Morris & Kamlay LLP

(57) ABSTRACT

A crystal oscillator may be configured to limit crystal drive level in the crystal oscillator by clamping via a diode-resistor branch, voltage applied to a drain pad of the crystal oscillator. The crystal oscillator may incorporate Pierce crystal oscillator based implementation. The crystal oscillator may comprise an on-chip main branch, comprising at least one transistor element; an on-chip drain branch connecting the main branch to a drain pad; an on-chip gate branch connecting the main branch to a gate pad. The diode-resistor branch may be connected to the drain branch, and may comprise at least one diode and at least one resistor element. The at least one diode and the at least one resistor element may be connected in series in the diode-resistor branch. The clamped voltage may be applied from an off-chip drain node, through the drain pad.

17 Claims, 4 Drawing Sheets

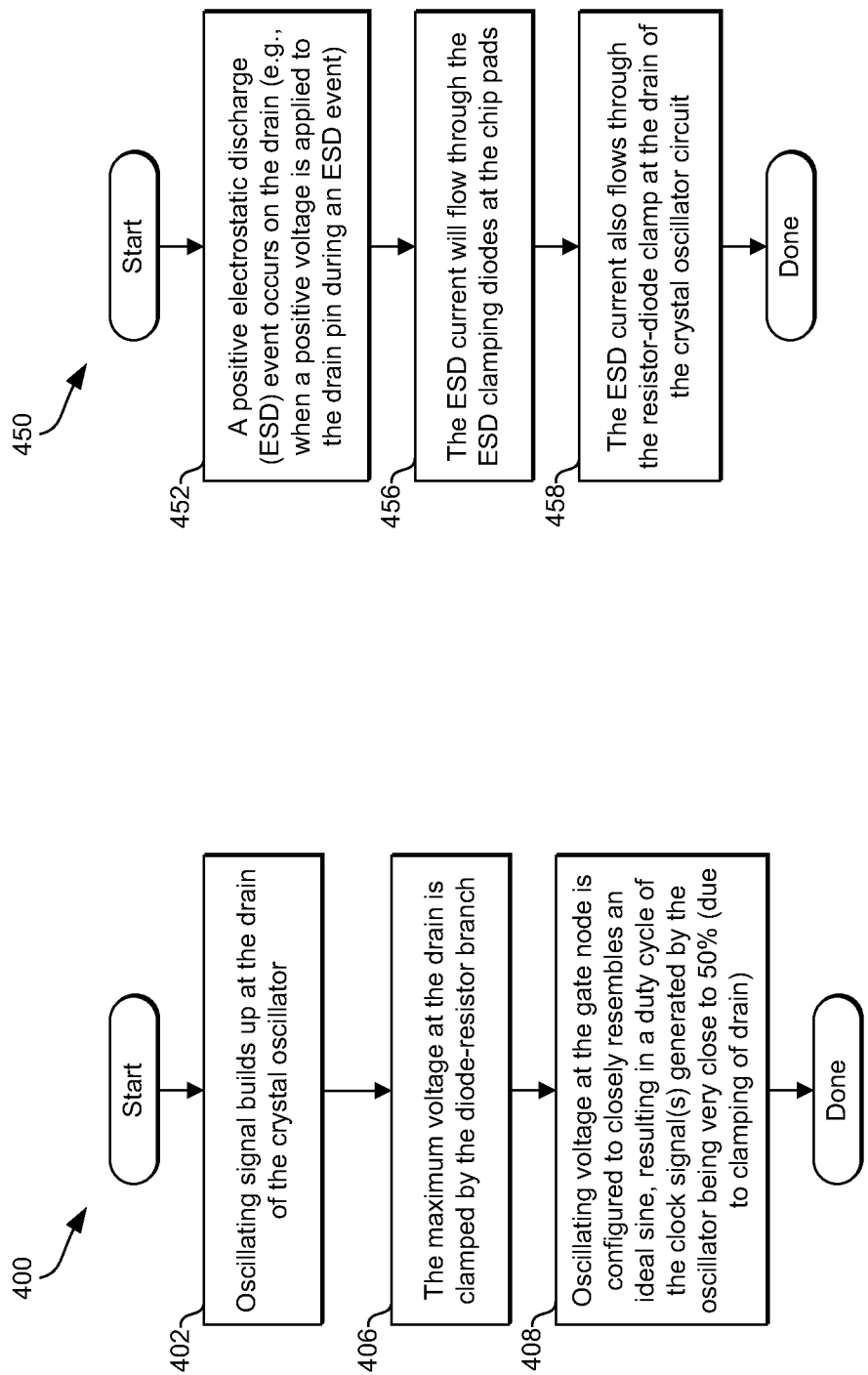

CRYSTAL OSCILLATOR WITH ELECTROSTATIC DISCHARGE (ESD) COMPLIANT DRIVE LEVEL LIMITER

TECHNICAL FIELD

Aspects of the present application relate to use of local oscillators in electronic devices. More specifically, certain implementations of the present disclosure relate to crystal oscillator with electrostatic discharge (ESD) compliant drive level limiter.

BACKGROUND

Various types of electronic devices are commonly used nowadays. In this regard, electronic devices may be used by one or more users, for various purposes, both business and personal. Electronic devices may be mobile or non-mobile; may support communication (wired and/or wireless); and/or may be general or special purpose devices. Examples of electronic devices may comprise handheld mobile devices (e.g., cellular phones, smartphones, and/or tablets), computers (e.g., laptops, desktops, and/or servers), and/or other similar devices.

In some instances, clock signals may be used in electronic devices, such as to drive and/or control operations (or timing thereof) of particular components or subsystems of the electronic devices. The electronic devices may comprise dedicated components, such as crystal oscillators, which may be utilized in generating clock signals. In this regard, crystal oscillators may be configured to generate electrical signals with a precise frequency based on mechanical resonance of vibrating crystals. The frequency of the electrical signals may be used to keep track of time, such as to enable providing precise and stable clock signals. It is important to ensure that crystals used in crystal oscillators are not damaged or degraded because of operations of the crystal oscillators.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for a crystal oscillator with an electrostatic discharge (ESD) compliant drive level limiter, substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

BRIEF DESCRIPTION OF SEVERAL VIEWS OF THE DRAWINGS

FIG. 4A is a flow chart that illustrates an example of clamping in a modified Pierce crystal oscillator, to limit crystal drive level, during normal operation.

FIG. 4B is a flow chart that illustrates an example of clamping in a modified Pierce crystal oscillator, to limit crystal drive level, during a positive electrostatic discharge (ESD) event.

DETAILED DESCRIPTION

The present disclosure relates to a method and system for crystal oscillator with an electrostatic discharge (ESD) compliant drive level limiter. In various example implementations, a crystal oscillator may be configured to limit crystal drive level, such as by clamping voltage applied from an on-chip circuitry of the crystal oscillator to off-chip component(s), by use of on-chip clamping. In this regard, the crystal oscillator may comprise the on-chip circuitry, off-chip components, which may comprise an external crystal and one or more related passive elements, which may constitute a gate node that may be connected to the on-chip circuitry via a gate pad, and an off-chip drain node that may be connected to the on-chip circuitry via a drain pad. The on-chip circuitry of the crystal oscillator may comprise a main branch comprising at least one transistor element, a drain branch that may connect the main branch to the drain pad, a gate branch that may connect the main branch to the gate pad, and a clamping branch that may be coupled to the drain branch. The clamping branch may comprise a clamping diode and a clamping resistor. In this regard, the drive level of the crystal may be limited by clamping via the clamping branch voltage applied to the drain pad of the crystal oscillator. The voltage may be applied to the drain pad from the off-chip drain node. The clamping diode and the clamping resistor of the clamping branch may be connected in series. The clamping resistor of the clamping branch may limit current flow through the one diode, such as during electrostatic discharge (ESD) events.

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "e.g.," introduces a list of one or more non-limiting examples, instances, or illustrations.

Figure 1:
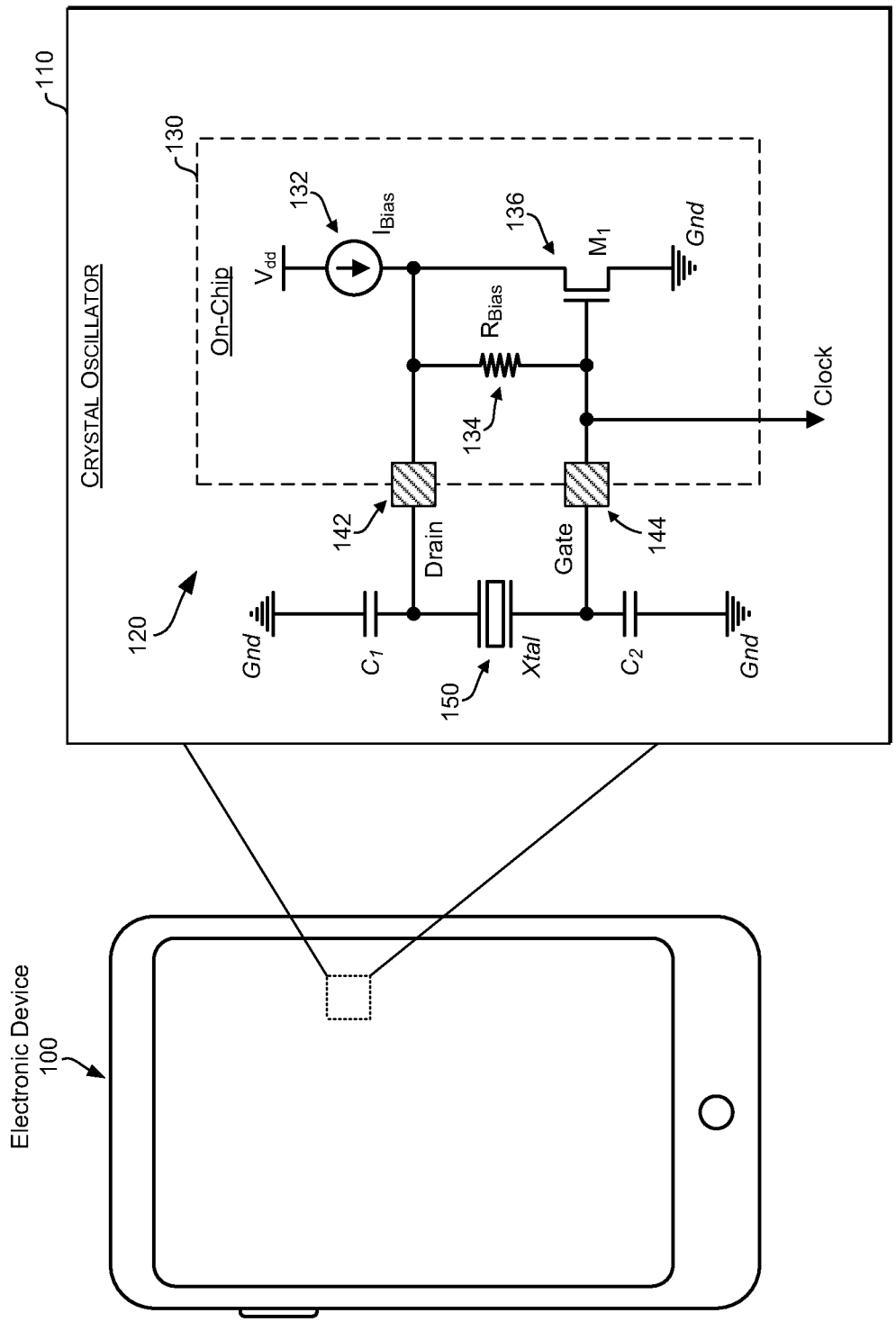
FIG. 1 is a block diagram illustrating an example of an electronic device comprising a crystal oscillator implementing a Pierce topology.

FIG. 1 is a block diagram illustrating an example of an electronic device comprising a crystal oscillator implementing a Pierce topology. Referring to FIG. 1 there is shown an electronic device 100.

The electronic device 100 may comprise suitable circuitry, interfaces, logic, and/or code that may be operable to perform various functions or operations, and/or run various applications and/or programs. In this regard, operations, functions, applications and/or programs supported by the electronic device 100 may be performed, executed and/or run based on user instructions and/or pre-configured instructions. In some instances, the electronic device 100 may enable communication of data or messages, such as via wired and/or wireless connections configured in accordance with one or more supported wireless and/or wired protocols or standards. Examples of electronic devices may comprise handheld mobile devices (e.g., cellular phones, smartphones, and/or tablets), computers (e.g., laptops, desktop or personal computers, and/or servers), dedicated multimedia devices (e.g., televisions, DVD or Blu-ray players, etc.), and/or other similar devices. The disclosure, however, is not limited to any particular type of electronic devices.

In some instances, some of the components or subsystems of the electronic device 100 may require clock signals, which may be utilized in controlling operations (or timing thereof) of these components or subsystems. In this regard, the electronic device 100 may be configured to generate clock signals, which may be used for clocking such components or subsystems. For example, the electronic device 100 may comprise dedicated components, such as crystal oscillators, which may be utilized in generating clock signals. A crystal oscillator (110) may comprise suitable circuitry, interfaces, logic, and/or code for creating electrical signal with precise frequency based on mechanical resonance of a vibrating crystal (e.g., a piezoelectric material). The frequency of the electrical signal may be used to keep track of time, such as to enable providing precise and stable clock signals.

The crystal oscillator 110 may be implemented using various topologies and/or methodologies. In some instances, the crystal oscillator 110 may be implemented using Pierce crystal oscillator based topology (120), as shown in FIG. 1 for example. In this regard, the Pierce crystal oscillator topology 120 may comprise an on-chip section 130, connected to an off-chip crystal 150. The on-chip section 130 may comprise a bias current ($I_{Bias}$) source 132, a bias resistor ($R_{Bias}$) 134, and a transistor ($M_1$) 136 (e.g., a field-effect transistor (FET) transistor). In the implementation shown in FIG. 1, given as a non-limiting example, the drain of the transistor $M_1$ 136 may be coupled through the $I_{Bias}$ source 132 to a drain voltage ($V_{DD}$), and the source of the transistor $M_1$ 136 may be connected to ground (GND). The bias resistor ($R_{Bias}$) 134 may be connected between the drain (before the $I_{Bias}$ source 132) and the gate of the transistor $M_1$ 136. In this regard, the $R_{Bias}$ 134 may act as a feedback resistor, biasing the transistor $M_1$ 136.

The off-chip crystal 150 may comprise a quartz crystal for example, and may be specifically selected based on a particular resonant frequency. In this regard, the resonance (or more specifically, resonant frequency) of the off-chip crystal 150 may be used in driving the clock generation in the Pierce crystal oscillator topology 120. The off-chip crystal 150 may be connected to (off-chip) drain and gate nodes of the on-chip section 130. In this regard, the off-chip crystal 150 may be coupled to the on-chip section 130 via drain and gate chip pads (142 and 144, respectively), which are in turn connected (within the on-chip section 130) to the drain and gate of the transistor $M_1$ 136. Furthermore, the off-chip drain and gate nodes may be connected to, respectively, external load capacitors $C_1$ and $C_2$, with the capacitors $C_1$ and $C_2$ being coupled to ground (GND). In this regard, the off-chip crystal 150, when arranged in combination with $C_1$ and $C_2$ in accordance with the implementation described herein may function as a band-pass filtering circuit, which may provide a phase shift and a voltage gain from output to input at approximately the resonant frequency of the off-chip crystal 150. In this regard, at the frequency of oscillation, the off-chip crystal 150 may appear inductive, and thus, it may be considered a large, high inductor. Accordingly, the combination of the phase shift (e.g., inverting gain) from the band-pass filtering circuit formed by the crystal (150) and the capacitors $C_1$ and $C_2$, and the negative gain from the inversion may result in a positive loop gain (or 'positive feedback'), which may render the bias point set by the bias resistor (the $R_{Bias}$ 134) unstable, leading to oscillation, thus resulting in periodic (at particular frequency) of clock signals.

In operation, the crystal oscillator 110, which may incorporate the Pierce crystal oscillator topology 120, may generate clock signals that may be utilized for driving and/or controlling operations of at least some components or subsystems of the electronic device 100. During operations of the crystal oscillator 110, such when generating clock signals, power may be may dissipated by the crystal oscillator 110 as a whole, and/or by various components thereof. In this regard, power dissipated in the off-chip crystal 150 may be referred to as the crystal drive level. Power dissipation by crystals (e.g., the off-chip crystal 150) may be undesirable because when left unchecked it may lead to damaging of the crystal, thus leaving the crystal oscillator inoperable. Therefore, to avoid crystal aging or damage, the crystal drive level may have to be maintained below a maximum drive level of the crystal being used, which may be predetermined (e.g., during design, manufacture, and/or testing of the crystal oscillator).

Another consideration that is pertinent to design and/or use of crystal oscillator circuits may be the crystal oscillator feedback gain. In this regard, it may be desirable to design crystal oscillators with high positive feedback gain to ensure robust startup over process, voltage, temperature, and/or crystal parameter skews. However, while increasing the circuit gain may provide increased startup robustness, it may also increase the crystal drive level. While external resistors (i.e., off-chip, being coupled to the drain and/or gate nodes) may be used to limit the crystal drive level, use of such external resistors may reduce the overall loop gain, which in turn may compromise startup robustness of the crystal oscillator as a whole. Therefore, in many instances it may be a challenge to design crystal oscillators which may provide sufficient gain over process, voltage, temperature, and/or crystal skews while maintaining the crystal drive level(s) under the applicable maximum drive level.

In various example implementations, crystal oscillator topologies may be modified or supplemented to allow for an increase in feedback gain while ensuring that crystals used therein may not be damaged or degraded as result of adverse effects of excessive crystal drive levels (above crystals' maximum drive levels). For example, in crystal oscillators implementing Pierce crystal oscillator based topologies (e.g., the Pierce crystal oscillator topology 120), clamping branches that may be added on-chip (e.g., in the on-chip section 130) to enable limiting currents may lead to adverse effects during scenarios involving excessive crystal drive levels. An example of an implementation of a modified Pierce crystal oscillator topology incorporating clamping branch is described in more detail with respect to FIG. 2. In some instances, the clamping performed in such manner (i.e., using on-chip branches) may also be configured to function and/or operate in conjunction with other means used to provide (or maintain) protection against other conditions that may cause damage in the crystal oscillator 150. For example, limiting currents in this manner (i.e., using on-chip branches) may also be used, for example, to protect against electrostatic discharge (ESD) events, which may occur as a result of a sudden flow of current between two objects due to voltage differences between the objects (e.g., during handling of the chip). In the context of crystal oscillators, ESD events may be undesirable because such sudden current flow or discharge may damage, for example, the on-chip section 130, such as when there is excessive voltage being applied at one or more of the chip pads (142 and 144), without having any means for any discharge (controlled or otherwise) within the on-chip section (130). Thus, dedicated ESD structures (e.g., branches) may be incorporated into the crystal oscillator topology to help prevent damage to on-chip circuitry (130)

during an ESD event, and thus to ensure ESD compliance. Such ESD structures may comprise, for example, clamping components that may added to the crystal oscillator topology (e.g., within the on-chip section 130) and may be selected and/or configured to ensure sufficient current flow through the on-chip section (130) during an ESD event, to ensure that the on-chip circuitry (130) is not subject to, and thus possibly be damaged by, any sudden current discharge or flow. In some instances, clamping may be done concurrently in such ESD structures and the new clamping structure being added to protect against excessive crystal drive levels.

Figure 2:
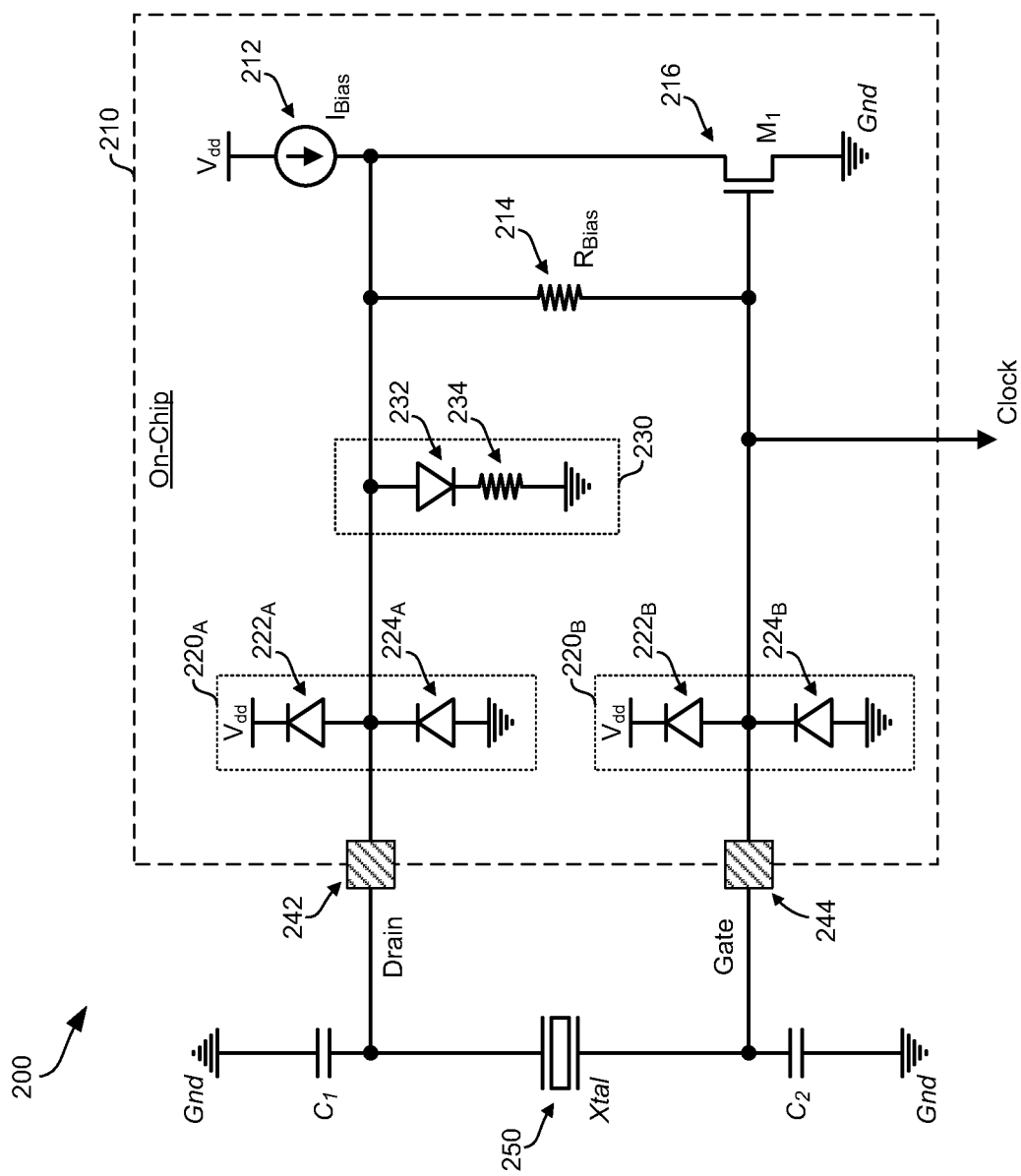
FIG. 2 is a block diagram illustrating an example of crystal oscillator implementing a modified Pierce topology with clamp based drive level limiting.

FIG. 2 is a block diagram illustrating an example of crystal oscillator implementing a modified Pierce topology with clamp based drive level limiting. Referring to FIG. 2 there is shown modified Pierce crystal oscillator 200.

The Pierce crystal oscillator 200 may implement a topology substantially similar to Pierce crystal oscillator topology 120 of FIG. 1 for example. The Pierce crystal oscillator 200 may be modified relative to that in FIG. 1, however, to provide drive level limiting that also does not affect overall loop gain in the oscillator. For example, the Pierce crystal oscillator 200 may comprise an on-chip section 210, connected to an off-chip crystal 250. The on-chip section 210 may comprise a bias current ($I_{Bias}$) source 212, a bias resistor ($R_{Bias}$) 214, and a transistor ($M_1$) 216, which may be similar to corresponding components: $I_{Bias}$ source 212, $R_{Bias}$ 214, transistor ($M_1$) 216 of on-chip section 130 of topology 120 of FIG. 1, and may be connected and/or coupled in the same manner as described with respect to FIG. 1 for example.

The off-chip crystal 250 may be similar to the crystal 150 of FIG. 1, for example, and may similarly be used in driving clock signal generation in the Pierce crystal oscillator 200. As with the Pierce crystal oscillator topology 120 of FIG. 1, the off-chip crystal 250 may also be connected to (off-chip) drain and gate nodes of the on-chip section 210. In this regard, the off-chip crystal 250 may be coupled to the on-chip section 210 via drain and gate chip pads 242 and 244, respectively, which may be similar to the chip pads 142 and 144 of FIG. 1, for example, which are in turn connected (within the on-chip section 210) to the drain and gate of the transistor $M_1$ 216. Furthermore, as with the Pierce crystal oscillator topology 120 of FIG. 1, the off-chip drain and gate nodes may be connected to, respectively, external load capacitors $C_1$ and $C_2$, with each of the capacitors $C_1$ and $C_2$ being coupled to ground (GND).

The Pierce crystal oscillator 200 may also comprise electrostatic discharge (ESD) branches $220_A$ and $220_B$, which may be configured to allow current flow during electronic discharge (ESD) events. In this regard, the ESD branches $220_A$ and $220_B$ may be coupled to each of the drain branch (connecting drain pad 242 and the drain of the resistor $M_1$ 216) and the gate branch (connecting gate pad 244 and the gate of the resistor $M_1$ 216). Each of the ESD branches $220_A$ and $220_B$ may comprise a first diode ($222_A$ and $222_B$, respectively) coupled to the $V_{DD}$, and a second diode ($224_A$ and $224_B$, respectively) coupled to the ground (GND).

In addition, the Pierce crystal oscillator 200 may comprise a drive level limiter clamping branch 230. In this regard, the clamping branch 230 may comprise suitable circuitry, interfaces, logic, and/or code for clamping voltages, and thus limiting current flows in the Pierce crystal oscillator 200 in a manner that may limit the amplitude of oscillation at the drain, and thus the crystal drive level, without compromising overall loop gain, startup or ESD robustness in the crystal oscillator. For example, the clamping branch 230 may comprise a clamping diode 232 connected in series to clamping resistor 234, which in turn is coupled to ground (GND). In this regard, the clamping resistor 234 may enable limiting current flow through the clamping diode 232 during electrostatic discharge (ESD) events.

In operation, the ESD branches $220_A$ and $220_B$ along with the clamping branch 230 may enable limiting crystal drive levels in the Pierce crystal oscillator 200. In this regard, during normal operation (i.e., no ESD events), the oscillating signal (caused by the resonance of the off-chip crystal 250) may build up at the drain side. In this regard, the maximum voltage at the drain side (i.e., as applied at the gate pad 242 from the gate node) may be clamped by the clamping branch 230, thus limiting the power dissipated in the off-chip crystal 250. At the same time, clock signal(s) may be derived from the gate side. In this regard, the oscillating voltage at the drain side is distorted due to the clamping being applied at the drain side. The oscillating voltage at the gate side, however, may closely resemble an ideal sine wave because the oscillating current that flows into capacitor $C_1$ may be filtered by the off-chip crystal 250. Thus, the duty cycle of the clock signal generated by the Pierce crystal oscillator 200 may be very close to 50%. During ESD events, the ESD branches $220_A$ and $220_B$ may function to limit current flow resulting from the electrostatic discharge. An example of such operation is described in more detail with respect to FIG. 3.

Figure 3:
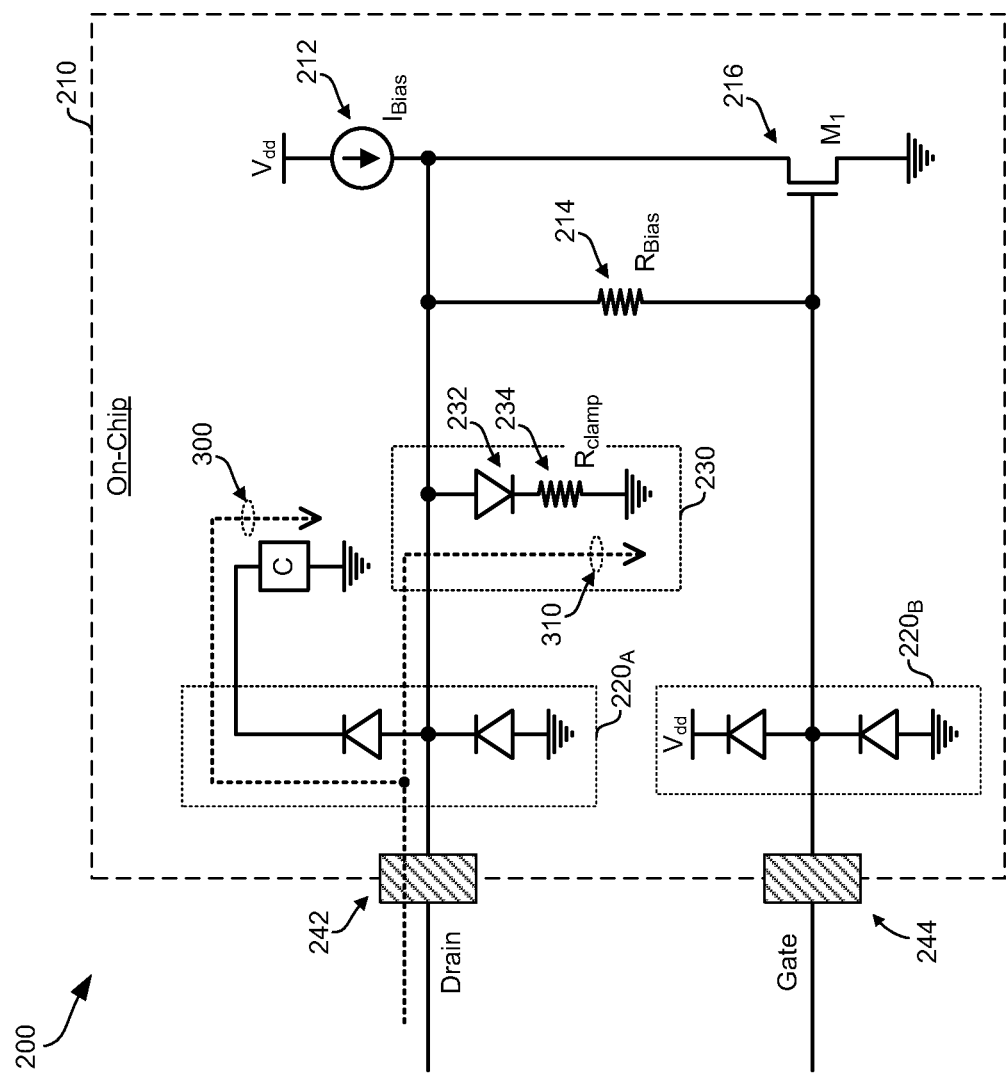
FIG. 3 is a block diagram illustrating an example of current flow in a modified Pierce crystal oscillator configured for crystal drive level limiting, during a positive electrostatic discharge (ESD) event.

FIG. 3 is a block diagram illustrating an example of current flow in a modified Pierce crystal oscillator configured for crystal drive level limiting, during a positive electrostatic discharge (ESD) event. Referring to FIG. 3, there is shown the modified Pierce crystal oscillator 200 of FIG. 2.

Pierce crystal oscillator 200 may be configured to handle electrostatic discharge (ESD) events. For example, during a positive ESD event on the drain side (e.g., when a positive voltage is applied to the drain pad 242 during an ESD event), the ESD branch $220_A$ and/or the clamping branch 230 may be used to limit current flow resulting from ESD event within the on-chip section 210, thus protecting the off-chip crystal 250. In this regard, ESD based current may flow (300) through the ESD clamping diodes (e.g., diodes $222_A$ and $224_A$) at the chip pads (e.g., drain pad 242). The ESD current may also flow (310) through the resistor-diode clamping branch 230 at the drain-side. In this regard, the clamping resistor 234 may be configured to limit the current flow (310) through the drive-level limiting diode (232) to prevent damage during such ESD events.

FIG. 4A is a flow chart that illustrates an example of clamping in a modified Pierce crystal oscillator, to limit crystal drive level, during normal operation. Referring to FIG. 4B, there is shown a flow chart 400 comprising a plurality of steps performed in a modified Pierce crystal oscillator during normal operation.

In step 402, oscillating signal builds up at the drain (242) of the crystal oscillator (200). In step 404, maximum voltage at the drain (242) may be clamped by the diode-resistor branch (clamping branch 230). In step 406, oscillating voltage at the gate (244) may be configured to closely resemble an ideal sine, thus resulting in a duty cycle of the clock signal(s) generated by the oscillator being very close to 50% (due to clamping at the drain side).

FIG. 4B is a flow chart that illustrates an example of clamping in a modified Pierce crystal oscillator, to limit crystal drive level, during positive electrostatic discharge (ESD) event. Referring to FIG. 4B, there is shown a flow chart 450 comprising a plurality of steps performed in a modified Pierce crystal oscillator during ESD event.

In step 452, an electrostatic discharge (ESD) event may occur in the crystal oscillator (200). For example, a positive ESD event may occur at the drain side (e.g., when a positive voltage is applied to the drain pin during an ESD event). In step 454, ESD current may flow through the ESD clamping diodes (e.g., diodes 222$_A$ and 224$_A$ of the drain side clamping branch 220$_A$). In step 456, the ESD current may also flow through the resistor-diode clamping branch (230) at the drain side of the crystal oscillator (200).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for crystal oscillator with ESD compliant drive level limiter.

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A method, comprising:
in a crystal oscillator that comprises an on-chip main branch comprising at least one transistor element, an on-chip drain branch connecting a drain terminal of the transistor element to a drain pad, an on-chip gate branch connecting the main branch to a gate pad, and a series-connected diode resistor branch connected in parallel with the drain branch, the diode-resistor branch comprising at least one diode and at least one resistor element:
limiting crystal drive level in the crystal oscillator by clamping via a diode-resistor branch voltage applied to the drain pad of the crystal oscillator.

2. The method of claim 1, comprising applying the voltage from an off-chip drain node.

3. The method of claim 1, wherein the at least one diode and the at least one resistor element are connected in series in the diode-resistor branch.

4. The method of claim 1, comprising limiting via the at least one resistor element of the diode-resistor branch current flow through the at least one diode.

5. The method of claim 4, comprising limiting the current flow through the at least one diode during an electrostatic discharge (ESD) event.

6. A crystal oscillator, comprising:
an off-chip drain node connected to an on-chip circuit via a drain pad;
an off-chip gate node connected the on-chip circuit via a gate pad; and
wherein the on-chip circuit comprises:
a main branch comprising at least one transistor element;
a drain branch between a drain terminal of the transistor element and the drain pad;
a gate branch between the main branch and the gate pad; and
a series-connected diode-resistor branch connected in parallel with the drain branch, the diode-resistor branch comprising at least one diode and at least one resistor element.

7. The crystal oscillator of claim 6, wherein the diode-resistor branch is configured to limit crystal drive level in the crystal oscillator by clamping voltage applied to the drain pad of the crystal oscillator.

8. The crystal oscillator of claim 7, wherein the voltage is applied from the off-chip drain node.

9. The crystal oscillator of claim 6, wherein the at least one diode and the at least one resistor element are connected in series in the diode-resistor branch.

10. The crystal oscillator of claim 6, wherein the at least one resistor element of the diode-resistor branch is operable to limit current flow through the at least one diode.

11. The crystal oscillator of claim 10, wherein the at least one resistor element is operable to limit the current flow through the at least one diode during an electrostatic discharge (ESD) event.

12. The crystal oscillator of claim 6, wherein the diode has a node connected directly to the drain branch.

13. A circuit, comprising:
a main branch comprising at least one transistor element;
a drain branch between a drain terminal of the transistor element and the drain pad;
a series-connected diode-resistor branch comprising at least one diode and at least one resistor element, wherein the diode-resistor branch is connected in parallel with the drain branch and a gate branch and wherein the diode resistor branch is connected to a drain pad of a crystal oscillator, the diode-resistor branch being configured to limit crystal drive level in the crystal oscillator by clamping via a diode-resistor branch voltage applied to the drain pad of the crystal oscillator.

14. The circuit of claim 13, wherein the voltage is applied from an off-chip drain node.

15. The circuit of claim 13, wherein the at least one diode and the at least one resistor element are connected in series in the diode-resistor branch.

16. The circuit of claim 13, wherein the at least one resistor element of the diode-resistor branch is operable to limit current flow through the at least one diode.

17. The circuit of claim 16, wherein the at least one resistor element of the diode-resistor branch is operable to limit current flow through the at least one diode during an electrostatic discharge (ESD) event.

* * * * *